US012695211B2

(12) United States Patent
Bigongiari et al.

(10) Patent No.: US 12,695,211 B2
(45) Date of Patent: Jul. 28, 2026

(54) ANTENNA ARRAY SYSTEM

(71) Applicant: Telefonaktiebolaget LM Ericsson (PUBL), Stockholm (SE)

(72) Inventors: Alessandra Bigongiari, Pisa (IT); Antonio D'Errico, Pisa (IT); Ingmar Andersson, Gothenburg (SE); Lars Manholm, Gothenburg (SE)

(73) Assignee: Telefonaktiebolaget LM Ericsson (PUBL), Stockholm (SE)

( * ) Notice: Subject to any disclaimer, the term of this patent is extended or adjusted under 35 U.S.C. 154(b) by 110 days.

(21) Appl. No.: 18/857,688

(22) PCT Filed: Apr. 20, 2022

(86) PCT No.: PCT/EP2022/060461
§ 371 (c)(1),
(2) Date: Oct. 17, 2024

(87) PCT Pub. No.: WO2023/202769
PCT Pub. Date: Oct. 26, 2023

(65) Prior Publication Data
US 2025/0260176 A1      Aug. 14, 2025

(51) Int. Cl.
*H01Q 21/06* (2006.01)
*H05K 1/02* (2006.01)
(52) U.S. Cl.
CPC ......... *H01Q 21/061* (2013.01); *H05K 1/0243* (2013.01); *H05K 1/0274* (2013.01); *H05K 2201/10098* (2013.01)
(58) Field of Classification Search
CPC .. H01Q 21/061; H05K 1/0243; H05K 1/0274; H05K 2201/10098
See application file for complete search history.

(56) References Cited

U.S. PATENT DOCUMENTS 10,908,499 B2      2/2021  Shi et al.
2017/0307701 A1*  10/2017  Leussler ................ G01R 33/36
(Continued)

FOREIGN PATENT DOCUMENTS

WO      WO2020125946 A1      6/2020

OTHER PUBLICATIONS

Ahmed Elkholy et al. "A 6.75-8.25-GHz-250-dB FoM Rapid On/Off Fractional-N Injection-Locked Clock Multiplier", IEEE Journal of Solid-State Circuits, vol. 53, No. 6, Jun. 2018 (due to size, this reference has been split into two parts).
(Continued)

*Primary Examiner* — Graham P Smith
(74) *Attorney, Agent, or Firm* — Baker Botts L.L.P.

(57) ABSTRACT

The disclosure provides an antenna array system, comprising: a printed circuit board; one or more radio-frequency circuits arranged on a surface of the printed circuit board; a plurality of optical-to-electrical converters electrically coupled to the one or more radio-frequency circuits; and an optical distribution layer arranged over the plurality of optical-to-electrical converters, for distributing one or more optical signals to the plurality of optical-to-electrical converters. The one or more radio-frequency circuits comprise an array of radiating antenna elements, and the optical distribution layer is arranged over a part of the surface of the printed circuit board such that the optical distribution layer does not cover the array of radiating antenna elements.

19 Claims, 4 Drawing Sheets

(56)  References Cited

U.S. PATENT DOCUMENTS

| 2018/0246284 | A1 | 8/2018 | Rehnström et al. |
| 2019/0229808 | A1 | 7/2019 | Calhoun et al. |
| 2021/0232045 | A1 | 7/2021 | Shi et al. |

OTHER PUBLICATIONS

Cyril C. Renaud et al. "Antenna Integrated THz Uni-Traveling Carrier Photodiodes", IEEE Journal of Selected Topics in Quantum Electronics, vol. 24, No. 2, Mar./Apr. 2018.

Jonathan B. Ashcom et al. "Femtosecond Laser-Induced Microexplosions in Transparent Materials"—IEEE 2001.

PCT Notification of Transmittal of the International Search Report and the Written Opinion of the International Searching Authority, or the Declaration issued for International application No. PCT/EP2022/060461—Nov. 25, 2022.

* cited by examiner

100

108

106

102

104

ANTENNA ARRAY SYSTEM

PRIORITY

This nonprovisional application is a U.S. National Stage Filing under 35 U.S.C. § 371 of International Patent Application Serial No. PCT/EP2022/060461 filed Apr. 20, 2022 and entitled "ANTENNA ARRAY SYSTEM," which is hereby incorporated by reference in its entirety.

TECHNICAL FIELD

Embodiments of the present disclosure relate to antenna array systems, and particularly antenna array systems in which signals are distributed optically to the antenna array.

BACKGROUND

There is a vision that 6G connectivity may deliver peak data rates of hundreds of Gb per second, together with sub-millisecond latency. In order to deliver such high data rates, there is an interest in the potential use of frequencies in the sub-terahertz and terahertz ranges to provide the necessary bandwidth and enable intensive use of the available transmission spectrum within localized areas.

Additionally, sub-THz bands can be used as wireless backhaul for sites where fiber is either unavailable or too costly in solutions such as Integrated access and backhaul (IAB), e.g., to densify networks with multi-band radio sites at street level.

However, sub-THz/THz frequencies differ from those of bands typically used for wide-area, contiguous coverage in mobile networks today. Therefore, the use of sub-THz frequencies in next-generation networks raises fundamental questions regarding usage environments, use cases, network topologies, and devices.

The present disclosure focuses on the last of these technical areas. From the point of view of devices, high frequencies pose the problem of signal integrity, increased losses, integration and size, shortening the maximum length of electrical traces. Radio hardware in particular is faced with this problem, such as antenna systems including several radiating elements driven by a matrix of radio frequency integrated chips (RFICs).

In the current design of the next-generation antenna systems, the baseband reference clock is multiplied by a factor N to achieve radio frequency (RF) generation, e.g. in the W band of the electromagnetic spectrum (approx. 75 to 110 GHz). Clock references may be provided using phase-locked loops (PLLs) and multipliers, close to the RFICs that drive the antenna elements. However, the different multiplication stages may degrade the phase noise limiting the transmission performance, which requires complex compensation techniques. Further, while high-performance oscillators (such as GaN voltage-controlled oscillators) may provide excellent phase noise performance, many high-performance oscillators may increase cost, complexity, and power consumption. Electrical circuits operating at high frequency are likely to have non-ideal characteristics as the electrical lines may be affected by non-negligible parasitic resistance, capacitance, and inductance. Thus, the parasitic effects push the operating conditions far from the optimal or theoretical figures.

A further point to consider is the synchronization of the signal phase at each RFIC for the multiplied signals, which is critical for applications such as beamforming. As the wavelength is reduced, the impact of synchronization errors on the signal phase is expected to increase. The precision needed to synchronize this phase shifting is impacted by the non-idealities and the fabrication precision of the electrical lines dedicated to high RF signal distribution in the subparts of an array antenna system. Different electrical line lengths introduce a different phase added to the signals arriving at different radiating elements. In the mmWave range, the required precision of electrical line length is in the order of micrometres. The effective path length is given by the amount of time it takes the signal to travel along a wire, foil path, or interconnect metal. Then, the effective path length depends on the electrical properties of the lines that may vary due to factors such as the temperature. Accurate design and calibration may equalize the physical length of the wire; however, since each path may have a slightly different impedance, it is difficult to truly match electrical path length over time, introducing a skew that reduces the achievable phase precision. In addition, crosstalk and other RF noise may alter phase detection mechanisms.

As a result of these problems, a phase precision of 1° or lower is hard to achieve predictably with state of the art electronics, where the electrical line density on the antenna board is very high (e.g., tens of electrical lines per mm$^2$).

In order to address these difficulties, various solutions have been proposed where optical carriers are used to deliver RF signals to the transmitting equipment. These solutions overcome the problem of signal integrity and are immune to electromagnetic interference. Additionally, the effect of temperature on the optical properties is very small in common optical waveguides (e.g. $10^{-5}$ K$^{-1}$ in silica) and a temperature variation $\Delta T > 100°$ K produces only a few nanometres of variation in the length of an optical waveguide which is a few centimetres long. Photonic solutions are therefore appealing to overcome the bottleneck of signal integrity, reduce power density and synchronize the RFICs.

However, an appropriate optical distribution system is necessary to apply these solutions in dense chip scenarios such as antenna array systems operating in the mm wavelength range (mmW). The critical point to address is the management of many optical waveguides that are required to reach photodiodes in positions near the integrated electronic chips. In an mmW antenna array, having, e.g., 1.5 cm$^2$ in size for an 8×8 array of antenna elements at 100 GHz (depending on the wavelength, the number of antenna elements, and their spacing), the optical waveguide distribution needs to be extremely compact.

International patent application WO 2020/125946 discloses an optical interconnect for optically coupling a first optical integrated circuit and a second optical integrated circuit. The optical interconnect comprises at least two layers of optically transparent material. While this structure is useful for propagating optical signals between separate optical integrated circuits, it does not address the problem of distributing optical signals in the compact environment of an integrated circuit comprising an array of antenna elements. The presence of radiating elements in the solution has an effect on the positioning of the optical distribution device, which is immune from electromagnetic radiation but may cause radiation losses due to its dielectric constant (which is typically between 3.6 and 4 in quartz and standard glass types used in photonics).

Embodiments of the disclosure seek to address these and other problems.

SUMMARY

One aspect of the disclosure provides an antenna array system, comprising: a printed circuit board; one or more radio-frequency circuits arranged on a surface of the printed circuit board; a plurality of optical-to-electrical converters electrically coupled to the one or more radio-frequency circuits; and an optical distribution layer arranged over the plurality of optical-to-electrical converters, for distributing one or more optical signals to the plurality of optical-to-electrical converters. The one or more radio-frequency circuits comprise an array of radiating antenna elements, and the optical distribution layer is arranged over a part of the surface of the printed circuit board such that the optical distribution layer does not cover the array of radiating antenna elements.

The proposed solution solves the problems of existing solutions that prevent the use of the optical distribution in small antenna array systems, such as those configured to transmit/receive in the mmW range. The proposed solution is a compact optical distribution device that fits the size of a typical antenna array operating in the mm wavelength range (e.g., with dimensions of one or a few cm). Further, in some embodiments, by placing the optical distribution layer on 'top' of existing PCB-mounted devices, the fabrication processes typically used to realize antenna PCBs or packages can be left substantially unchanged. That is, the optical distribution layer may be fabricated and fitted in a separate step. Input fibers (from the optical source to the distribution device) can be attached to the optical distribution layer before the layer is mounted on the antenna package. This solution simplifies the antenna packaging/assembly operations.

In some embodiments of the disclosure, optical signals are delivered to the optical-to-electrical converters directly, without any fiber or optical connector between the optical distribution layer and the optical-to-electrical converter: this reduces the overall footprint of the solution and enables the distribution of optical signals to a dense set of receiving photodiodes (e.g. one per mm$^2$).

Antenna array systems according to the present disclosure are stable to large temperature variations and immune from electromagnetic radiation noise that may cause skew in signal distribution over electrical lines.

The optical distribution layer may enable the remote calibration of the phase of the signal that is received at the antenna element since it would be possible to apply optical techniques to measure and control the difference in the optical path length to reach each optical-to-electrical converter.

BRIEF DESCRIPTION OF THE DRAWINGS

The present disclosure is described, by way of example only, with reference to the following figures, in which.

DETAILED DESCRIPTION

For the purpose of explanation, details are set forth in the following description in order to provide a thorough understanding of the embodiments disclosed. It will be apparent, however, to those skilled in the art that the embodiments may be implemented without these specific details or with an equivalent arrangement.

According to embodiments of the disclosure, an antenna array system comprises: a printed circuit board; one or more radio-frequency circuits arranged on a surface of the printed circuit board; a plurality of optical-to-electrical converters electrically coupled to the one or more radio-frequency circuits; and an optical distribution layer arranged over the plurality of optical-to-electrical converters, for distributing one or more optical signals to the plurality of optical-to-electrical converters. The one or more radio-frequency circuits comprise an array of radiating antenna elements, and the optical distribution layer is arranged over a part of the surface of the printed circuit board such that the optical distribution layer does not cover the array of radiating antenna elements.

In certain embodiments, the optical distribution layer is provided in a layer above the printed circuit board, which makes manufacture of the antenna array system simpler and reduces wastage during the manufacturing process. The optical distribution layer may be clamped and/or glued on to the printed circuit board once other connections have been made, and this avoids substantial changes in the technology/method used for the fabrication of the antenna system. Further, by leaving the antenna array uncovered, optical signals can be distributed to the antenna array without interfering with the transmitted radio signals.

Figure 1:
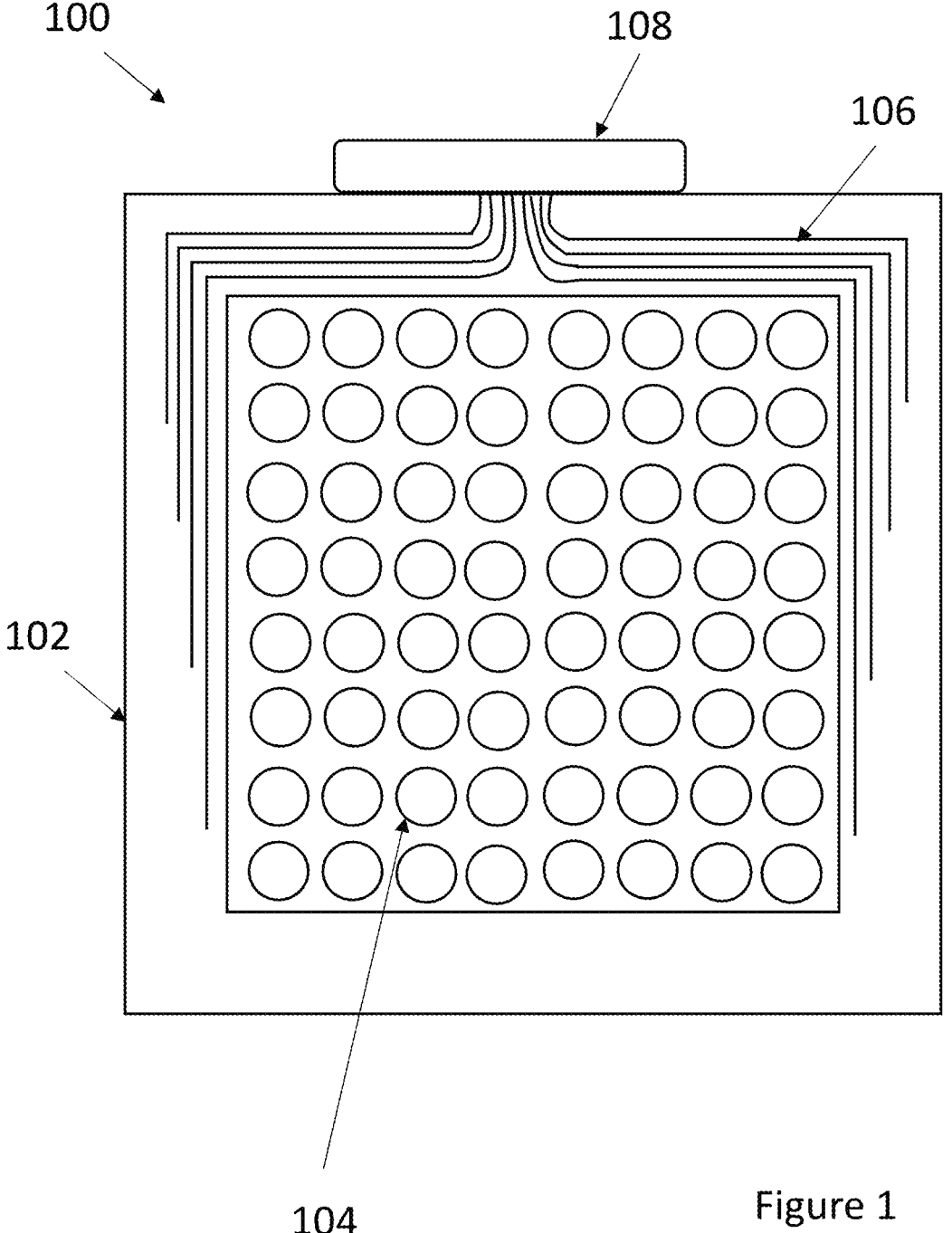
FIG. 1 is a plan view of an antenna array system according to embodiments of the disclosure.
Figure 2:
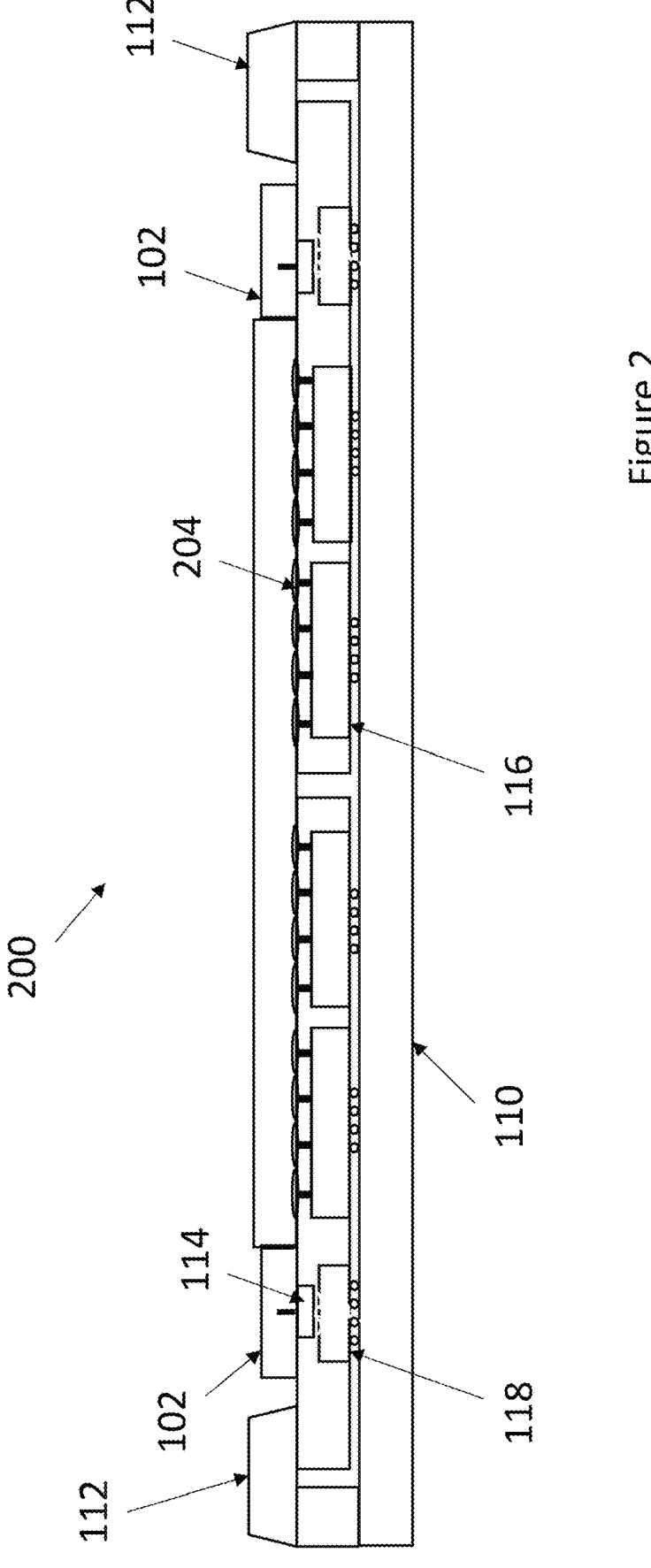
FIG. 2 is a cross section view of an antenna array system according to embodiments of the disclosure.

FIG. 1 is a plan view of an antenna array system 100 according to embodiments of the disclosure. FIG. 2 shows a cross-section view of an antenna array system 200, which corresponds to the antenna array system 100 but comprises a different number of antenna elements.

The antenna array systems 100, 200 comprise a printed circuit board (PCB) or other substrate 110. An array of antenna elements 104, 204 are positioned on one surface of the PCB 110, which will be referred to herein as an "upper surface" of the PCB 110 for convenience. Each antenna element 104, 204 is capable of radiating electromagnetic energy so as to transmit and/or receive radio signals. The antenna elements 104, 204 may be particularly adapted to transmit and/or receive electromagnetic radiation having a wavelength in the order of millimetres (so-called mmW radiation), and/or a frequency in the sub-THz or THz range.

Each antenna element 104, 204 is connected to processing circuitry, e.g. provided on a radio-frequency integrated circuit (RFIC) 116, which is affixed to the upper surface of the PCB 110 through conventional mounting techniques. The systems 100, 200 thus comprise one or more RFICs 116 which comprise the arrays of antenna elements 104, 204. The arrays of antenna elements 104, 204 may be provided on a single RFIC, or distributed across multiple RFICs. Each RFIC 116 may therefore comprise one or multiple antenna elements 104, 204; in the illustrated embodiment, each RFIC 116 has at least four antenna elements 204 (as seen in FIG. 2).

As used herein, the term "array" is used to describe a plurality of antenna elements arranged in a regular pattern and in close proximity to each other. The term does not imply any particular geometric shape. For example, while in some embodiments (e.g., as shown in FIG. 1) the array of antenna elements is square, in other embodiments the array may have a rectangular, non-square shape or even a non-rectangular shape.

In the embodiment illustrated in FIG. 1, the antenna array comprises an 8×8 array of antenna elements 104; in the embodiment illustrated in FIG. 2, the antenna array has at least one dimension of 16 antenna elements 204 (e.g., a 16×16 antenna array assuming a square array).

Referring to FIG. 2, the antenna elements 204 transmit and/or receive radio signals to, and/or from, an upward direction, as shown. The upward direction may be considered as a direction away from the PCB 110 supporting the antenna elements 204, and in particular, away from the plane of the PCB 110. The upward direction, or radiating direction, may be in substantially the same direction as the multiple antenna elements 204 are mounted on the PCB 110.

The antenna array systems 100, 200 further comprise an optical distribution layer 102, for distributing one or more optical signals to the RFICs 116. The optical distribution layer 102 is manufactured from an optically transparent material, to allow the transmission of optical signals without significant attenuation, such as glass, quartz, silica etc. In some embodiments, the optical distribution layer 102 is a passive component.

According to some embodiments of the disclosure, the optical distribution layer 102 is provided in a layer which is above at least one of the PCB 110, RFICs 116 and/or the antenna elements 104, 204. That is, the RFICs 116 are disposed at a level between the PCB 110 and the optical distribution layer 102. Thus, the RFICs 116 are closer to the PCB 110 than the optical distribution layer 102. In some aspects, the optical distribution layer is spaced away from the PCB 110. In some aspects, the optical distribution layer 102 does not directly overlie the RFICs 116 connected to the antenna elements 104, 204. The optical distribution layer 102 may be attached to the PCB 110 via any suitable means, such as glue or other affixing substance or, as shown in FIG. 2, one or more clamps 112 arranged at the periphery of the layer 102.

The optical distribution layer 102 is further arranged over a part of the upper surface of the PCB 110 that does not cover the antenna elements 104, 204. In this way, the optical distribution layer 102 does not interfere with the radio signals transmitted by those elements 104, 204. In other words, the optical distribution layer 102 is arranged over a first part of the upper surface of the PCB 110, whereas the array of antenna elements 104, 204 is arranged over a second part of the upper surface of the PCB 110 that is different from the first part.

For example, the optical distribution layer 102 may be arranged around some or all of a periphery of the RFICs 116. For example, where the PCB 110 does not extend significantly beyond the dimensions of the optical distribution layer 102, the optical distribution layer 102 may be arranged towards some or all of a periphery of the PCB 110, whereas the array of antenna elements 104, 204 may be arranged towards a central region of the PCB 110. In the illustrated embodiment, the optical distribution layer 102 is arranged around the entire periphery of the RFICs 116. In this way, the optical distribution layer 102 substantially surrounds the array of antenna elements 104, 204. Note that, in this context, the term "surrounds" does not imply that the optical distribution layer 102 completely encases the array of antenna elements 104, 204, as this would interfere with radio transmissions from the antenna elements 104, 204. Instead, the optical distribution layer 102 surrounds the antenna elements 104, 204 within a plane that is substantially parallel to the upper surface of the PCB 110. The optical distribution layer 102 is extends around some or all of the periphery of the array of antenna elements 104,204. The optical distribution layer 102 does not extend over (i.e. cover) the array of antenna elements 104,204. The optical distribution layer 102 has an internal opening that substantially corresponds in shape and size to the array of antenna elements 104, 204. The optical distribution layer 102 thus forms a frame that lies outside the array of antenna elements 104, 204. In the illustrated embodiment, the array is square, and thus the internal opening is also square.

The antenna array system 100 further comprises a plurality of optical-to-electrical converters 114, such as photodiodes (PDs), arranged underneath the optical distribution layer 102 on the upper surface of the PCB 110. As noted above, the signal to be detected by the optical-to-electrical converter 114 may be in the 100 GHz range. For this reason, uni-travelling carrier (UTC) PDs may be a suitable choice. These are high-speed photodiodes capable of detecting signals up to the THz range. The response of a UTC-PD is determined by the electron transport in the whole structure. This aspect differs from conventional pin PDs, where both electrons and holes contribute to the device response, and low-velocity hole-transport may limit performance.

Note that the optical-to-electrical converters 114 are arranged beneath the optical distribution layer 102 in the illustrated embodiment. In other embodiments, the optical-to-electrical converters 114 may be arranged within (e.g., integrated with) the optical distribution layer 102. In the latter case, an electrical connection may be provided from the optical distribution layer 102 (e.g., from the optical-to-electrical converter 114 in the optical distribution layer 102) to a pad on the PCB 110. If the optical-to-electrical converter 114 is arranged on the PCB 110 (as illustrated), the optical-to-electrical converter 114 may receive light from a vertical aperture in the optical distribution layer 102. In either case, optical signals may be directed from the optical distribution layer 102 to the optical-to-electrical converters 114 without need of any further connectors.

The optical-to-electrical converters 114 are electrically coupled to the processing circuitry (e.g. RFICs 116). The optical-to-electrical converters 114 are configured to receive optical signals via the optical distribution layer 102 and to extract a radio-frequency signal from those optical signals. Electrical signals corresponding to the radio-frequency signal are then forwarded to the RFICs 116 to implement the transmission of radio signals.

In the illustrated embodiment, the optical-to-electrical converters 114 are provided on mixer integrated circuits 118 arranged on the upper surface of the PCB 110. The mixer integrated circuits 118 may also receive a baseband signal, which may be generated by other circuitry connected to the antenna system (not shown), comprising data for transmission by the radiating antenna elements. For example, the mixer integrated circuits 118 may comprise up-down converter circuits, designed to mix the baseband signal with the radio-frequency signal extracted by the optical-to-electrical converters 114 and upconvert the frequency of the baseband signal to radio frequency for transmission by the antenna elements 104, 204. Thus, the mixer integrated circuits 118 may be electrically coupled to the RFICs 116 (e.g., via a suitable conductive track on or in in the PCB 110).

Note that the number of optical-to-electrical converters 114 may not be the same as the number of radiating elements 104, 204 or the number of RFICs 116. For example, in one embodiment, each optical-to-electrical converter 114 may have a corresponding RFIC 116; that is, in such an embodiment, one optical signal may be used to drive the radiating antenna elements on one corresponding RFIC. The number of RFICs and optical-to-electrical converters 114 is the same. However, in other embodiments, the same optical signal may be used to drive the radiating antenna elements from multiple RFICs; in these embodiments, there may be more RFICs than optical-to-electrical converters 114. Further, as noted previously, each RFIC may have one or multiple antenna elements; where an RFIC has multiple antenna elements, each antenna element may be driven by the same optical signal or by different optical signals.

In order to distribute the optical signals to the optical-to-electrical converters 114 with sufficient signal power, the optical distribution layer 102 comprises a set of optical waveguides 106. Each waveguide receives an optical signal from a fibre attach unit 108 and provides the optical signal to a corresponding optical-to-electrical converter 114. Note that, in alternative embodiments, a waveguide 106 may comprise one or more forks or splits, such that a single optical signal is provided to more than one optical-to-electrical converter 114. Similarly, the optical fibre providing the optical signals to the waveguides 106 may be split so that the same optical signal is provided to more than one waveguide 106.

The waveguides 106 may be formed using any suitable technique, such as chemical doping using Si:Ge or laser etching/scribing to change (increase) the refractive index in localized areas of the optical distribution layer 102 and so guide optical energy along a preferred path through the optical distribution layer 102. The fibre attach unit 108 may comprise a plurality of optical fibres (not illustrated) bundled together, with each optical fibre physically coupled to one end of a corresponding waveguide 106 using one or more known techniques, such as V-groove or pigtail connections.

In order to reduce cross-coupling of optical signals between waveguides and increase the number of connections per unit surface, the waveguides 106 may be formed at a different depth in the optical distribution layer 102 (thus increasing the physical separation of each waveguide from other waveguides). That is, once the optical distribution layer 102 is attached to the PCB 110, the waveguides 106 may be formed at different distances from the upper surface of the PCB 110. This may be achieved via free-form laser induced waveguides, or multi-layer arrangements as described for example in WO 2020/125946, the contents of which are hereby incorporated by reference. Additionally or alternatively, the waveguides 106 may be formed at different lateral distances through the optical distribution layer 102 (e.g., different distances from the antenna array 104, 204).

As shown in FIG. 1, the majority of the optical length of each waveguide 106 may be formed substantially parallel to the upper surface of the PCB 110, directing optical energy from the fibre attach unit 108 towards an optical-to-electrical converter 114 elsewhere on the PCB 110. However, it is also necessary for the optical energy to be directed downwards, towards the upper surface of the PCB 110 and the optical-to-electrical converters 114.

Figure 3:
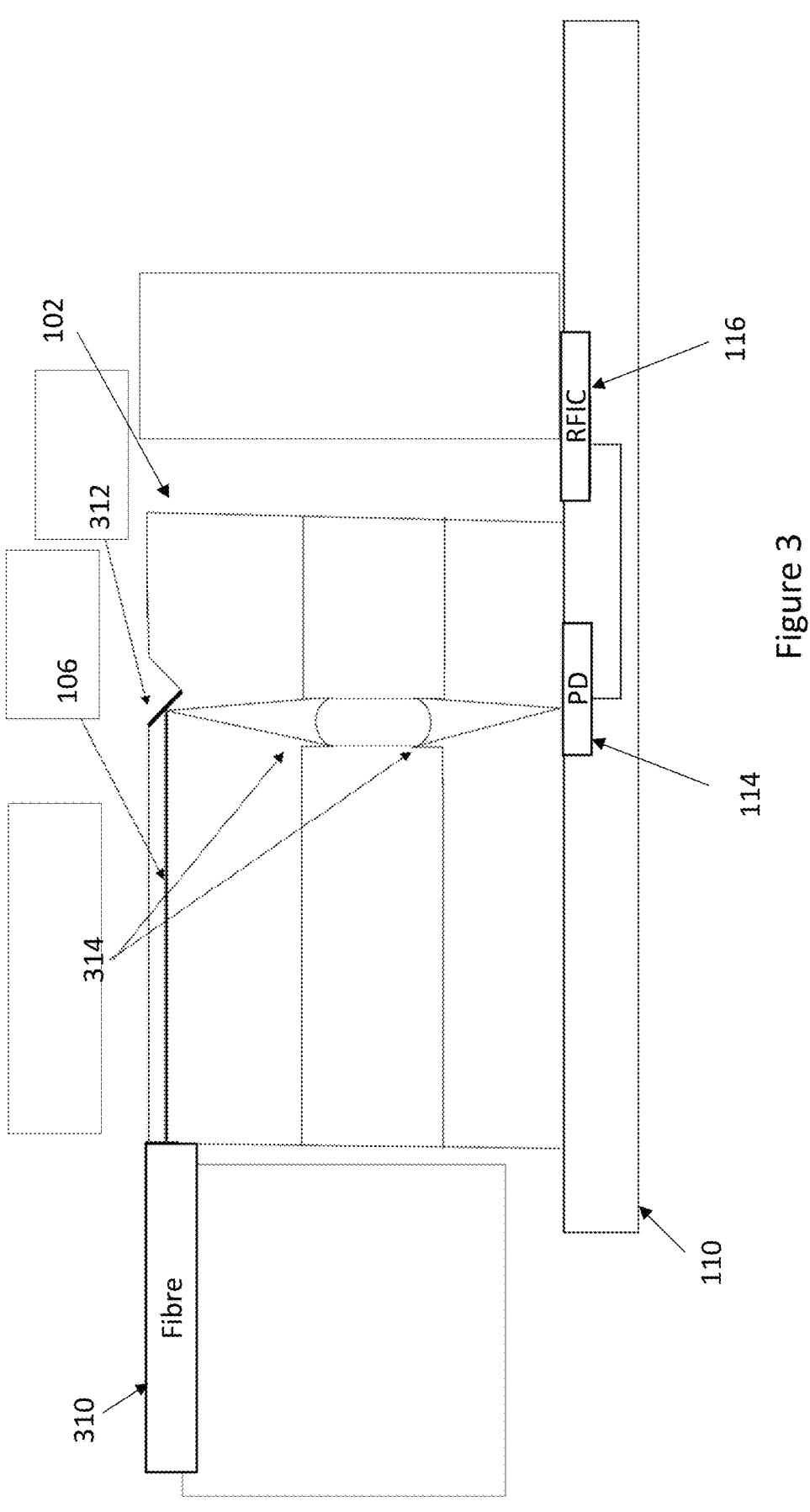
FIG. 3 shows a mechanism for distributing optical signals through an optical distribution layer according to embodiments of the disclosure.

FIG. 3 is a schematic diagram showing a first mechanism for distributing optical signals through the optical distribution layer 102 towards an optical-to-electrical converter 114 according to embodiments of the disclosure. The drawing shows an optical fibre 310 (e.g., as may be provided with the fibre attach unit 108) providing an optical signal to a waveguide 106 in the optical distribution layer 102. In this drawing, the optical-to-electrical converter 114 (e.g. photodiode) is not shown separately from the mixer circuits 118.

In this embodiment, the optical distribution layer 102 comprises a micromirror 312, which is positioned at the end of the waveguide 106 and angled to direct the optical signal downwards, towards the optical-to-electrical converter 114. First and second micro-lenses 314 focus the optical energy towards the optical-to-electrical converter 114 to increase the signal power detected at the optical-to-electrical converter 114. For example, the micro-lenses 314 may be formed by altering the refractive index of the material optical distribution layer 102, or using elements of different refractive index.

The first mechanism has the advantage of minimizing the bending losses due to horizontal to vertical routing, maximizing received power at the optical-to-electrical converter 114.

Figure 4:
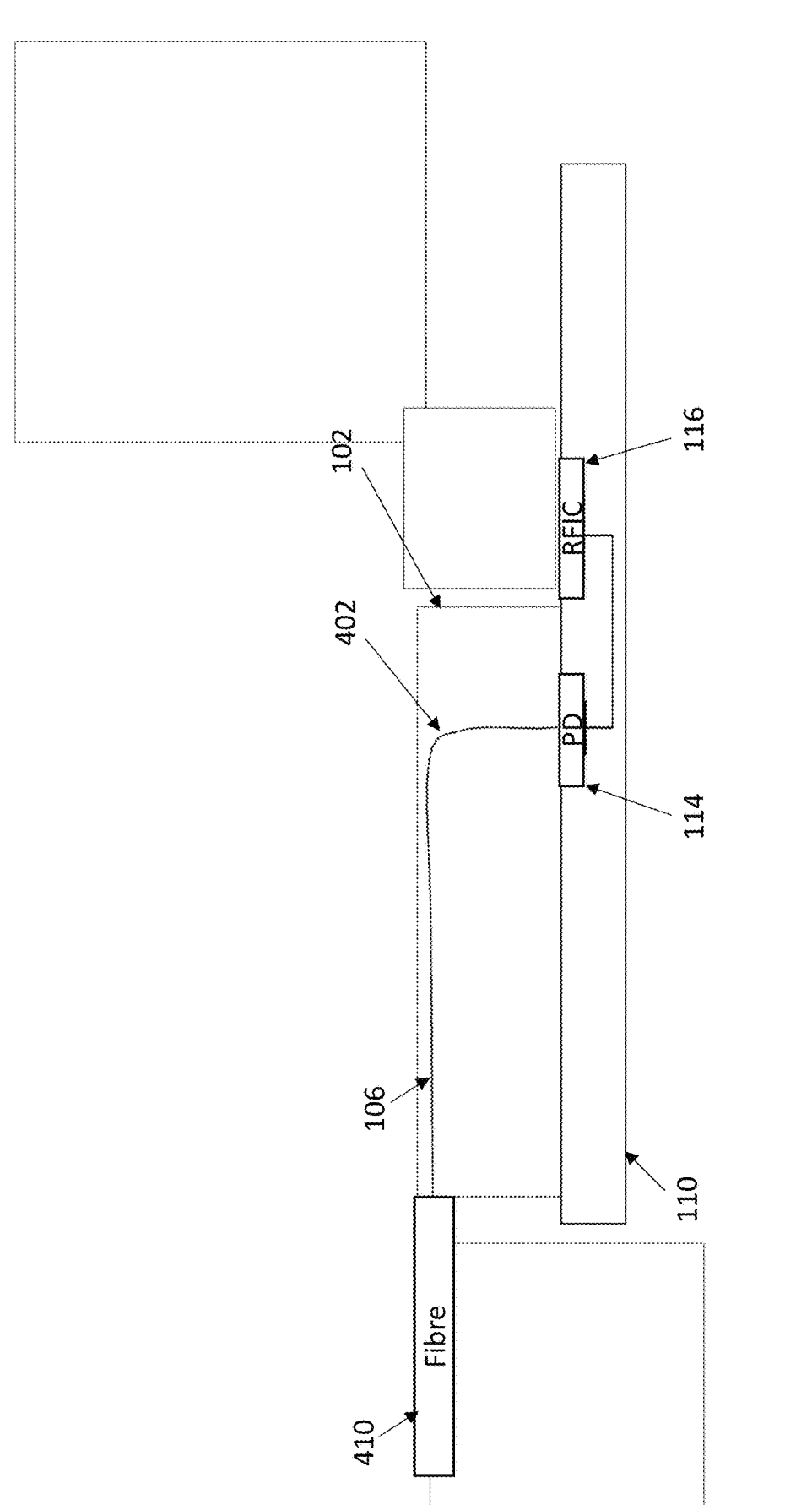
FIG. 4 shows a mechanism for distributing optical signals through an optical distribution layer according to further embodiments of the disclosure.

FIG. 4 is a schematic diagram showing a second mechanism for distributing optical signals through the optical distribution layer 102 towards an optical-to-electrical converter 114 according to further embodiments of the disclosure. The drawing shows an optical fibre 410 (e.g., as may be provided with the fibre attach unit 108) providing an optical signal to a waveguide 106 in the optical distribution layer 102. In this drawing, the optical-to-electrical converter 114 (e.g. photodiode) is not shown separately from the mixer circuits 118.

In this embodiment, the waveguide 106 is formed to direct optical energy from the fibre 410 to the optical-to-electrical converter 114 directly. For example, the waveguide 106 is formed by altering the refractive index of the material optical distribution layer 102, or using elements of different refractive index. Thus, the waveguide 106 is formed with a bend 402 which directs energy from the direction substantially parallel to the upper surface of the PCB 110 to a direction towards the optical-to-electrical converter 114. The bend 402 may be formed substantially above the optical-to-electrical converter 114. The second mechanism has the advantage of being easy to manufacture, with fewer parts requiring installation than the first mechanism. However, the radius of the bend 402 is limited, so as to avoid excessive loss of optical energy.

In both mechanisms shown in FIGS. 3 and 4, the optical-to-electrical converter 114 receives energy vertically; that is, an input port of the optical-to-electrical converter 114 is configured to receive energy in a direction perpendicular to the upper surface of the PCB 110. If the optical-to-electrical converter 114 is designed to have a horizontal input, a vertical coupler (such as a grating coupler) may be used to redirect optical energy from the vertical direction output by either the first or second mechanisms described above, to a substantial horizontal direction (parallel to the upper surface of the PCB 110) to deliver light to the optical-to-electrical converter 114.

As noted above, in some embodiments the optical signals may comprise a radio-frequency carrier signal used to carry an upconverted baseband signal. In other embodiments, the optical signals may comprise a clock reference signal used to drive the functioning of the mixer circuits 118 and/or the RFICs 116. The radio-frequency signal carried by the optical signals may be generated using any suitable technique, such as amplitude or phase modulation of an optical carrier, or the use of a beat signal from two laser sources.

Embodiments of the disclosure thus provide an antenna array system in which an RF signal can be provided via an optical carrier to an antenna array in a scenario of high chip density. In particular, the solution addresses the case of an array of antenna elements operating in the high-frequency range (>90 GHz).

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-limiting and exemplary embodiments of this disclosure. For the avoidance of doubt, the scope of the disclosure is defined by the claims.

The invention claimed is:

1. An antenna array system, comprising:
a printed circuit board;
one or more radio-frequency circuits arranged on a surface of the printed circuit board, the one or more radio-frequency circuits comprising an array of radiating antenna elements;
a plurality of optical-to-electrical converters electrically coupled to the one or more radio-frequency circuits; and
an optical distribution layer arranged over the plurality of optical-to-electrical converters, for distributing one or more optical signals to the plurality of optical-to-electrical converters,
wherein the optical distribution layer is arranged over a part of the surface of the printed circuit board such that the optical distribution layer does not cover the array of radiating antenna elements.

2. The antenna array system according to claim 1, wherein the optical distribution layer is arranged at least partially around a periphery of the one or more radio-frequency circuits.

3. The antenna array system according to claim 1, wherein the one or more radio-frequency circuits are arranged in a layer between the printed circuit board and the optical distribution layer.

4. The antenna array system according to claim 1, wherein the array of radiating antenna elements are arranged in a layer between the printed circuit board and the optical distribution layer.

5. The antenna array system according to claim 1, wherein the one or more radio-frequency circuits and the array of radiating antenna elements are arranged in a central region of the surface.

6. The antenna array system according to claim 1, wherein the optical distribution layer distributes the one or more optical signals to the plurality of optical-to-electrical converters without the use of optical connectors between the optical distribution layer and the optical-to-electrical converters.

7. The antenna array system according to claim 1, wherein the optical distribution layer comprises a plurality of optical waveguides for directing the one or more optical signals towards the optical-to-electrical converters.

8. The antenna array system according to claim 7, wherein the optical waveguides are arranged at different distances from the surface of the printed circuit board.

9. The antenna array system according to claim 7, wherein the optical waveguides direct the one or more optical signals along a direction substantially parallel to the surface of the printed circuit board in a first part of the optical waveguide, and along a direction substantially perpendicular to the surface of the printed circuit board in a second part of the optical waveguide.

10. The antenna array system according to claim 9, wherein the first part of the optical waveguide is arranged around a periphery of the one or more radio-frequency circuits.

11. The antenna array system according to claim 7, wherein the optical waveguides comprise micro-lenses to focus the one or more optical signals at the optical-to-electrical converters.

12. The antenna array system according to claim 7, wherein the optical distribution layer comprises a respective optical waveguide for each optical-to-electrical converter.

13. The antenna array system according to claim 7, further comprising a fibre attach unit coupling a plurality of optical fibres to the plurality of optical waveguides.

14. The antenna array system according to claim 7, wherein the optical waveguides are formed by a localized variation in refractive index of the optical distribution layer.

15. The antenna array system according to claim 1, wherein the radiating antenna elements are configured to transmit radio signals having a frequency of at least 90 GHz.

16. The antenna array system according to claim 1, wherein the one or more optical signals comprise one or more of: a clock reference signal and a radio-frequency carrier signal.

17. The antenna array system according to claim 1, wherein the plurality of optical-to-electrical converters are electrically coupled to the one or more radio-frequency circuits-via mixing devices, and wherein the mixing devices are further arranged to receive a baseband signal.

18. The antenna array system according to claim 1, comprising a plurality of radio-frequency circuits, and wherein each radio-frequency circuit comprises at least one radiating antenna element.

19. The antenna array system according to claim 1, wherein each optical-to-electrical converter is electrically coupled to a single radio-frequency circuit.

* * * * *